United States Patent [19]

El-Kareh et al.

[11] Patent Number: 4,725,562
[45] Date of Patent: Feb. 16, 1988

[54] METHOD OF MAKING A CONTACT TO A TRENCH ISOLATED DEVICE

[75] Inventors: Badih El-Kareh, South Hero; Richard R. Garnache, Shelburne, both of Vt.; Ashwin K. Ghatalia, Hopewell Junction, N.Y.

[73] Assignee: International Business Machines Corporation, Armonk, N.Y.

[21] Appl. No.: 844,655

[22] Filed: Mar. 27, 1986

[51] Int. Cl.⁴ .......................................... H01L 21/302
[52] U.S. Cl. ...................................... 437/67; 437/33; 437/225; 437/187; 437/235
[58] Field of Search .................. 29/576 W; 156/659.1, 156/652, 661.1, 643; 148/DIG. 75, DIG. 50

[56] References Cited

U.S. PATENT DOCUMENTS

| 3,385,729 | 5/1968 | Larchain | 117/200 |
| 3,603,820 | 9/1971 | Schuenemann | 307/305 |
| 4,048,649 | 9/1977 | Bohn | 357/43 |
| 4,110,779 | 8/1978 | Rathbone | 357/34 |
| 4,174,252 | 11/1979 | Kressel et al. | 156/653 |
| 4,196,440 | 4/1980 | Anantha | 357/35 |
| 4,242,156 | 12/1980 | Peel | 148/175 |
| 4,369,565 | 1/1983 | Muramatsu | 29/580 |
| 4,519,128 | 5/1985 | Chesebro et al. | 29/576 |
| 4,534,826 | 8/1985 | Gath et al. | 156/661.1 |
| 4,541,168 | 9/1985 | Galie et al. | 148/187 |
| 4,549,927 | 10/1985 | Gath et al. | 29/576 W |
| 4,589,193 | 5/1986 | Gath et al. | 29/578 |
| 4,599,136 | 7/1986 | Araps et al. | 29/580 |

FOREIGN PATENT DOCUMENTS

| 0106133 | 6/1984 | Japan | 29/576 W |
| 0189652 | 10/1984 | Japan | 29/576 W |

OTHER PUBLICATIONS

M. D. Hulvey et al, IBM Technical Disclosure Bulletin, vol. 24, No. 11A, Apr. 1982, pp. 5458-5459, "Dielectric Isolation Process".
I. Antipox, IBM Technical Disclosure Bulletin, vol. 23, No. 11, Apr. 1981, pp. 4917-4919, "Prevention of Birdsbeak Formation".
P. M. Schaible et al, IBM Technical Disclosure Bulletin, vol. 17, No. 10, Mar. 1975, pp. 2893-2894, "Forming Sidewall Dielectric Isolation of Integrated Circuit Devices".
Dougherty, J.J. US patent application SN 06/793400 filed 10/85.

Primary Examiner—Brian E. Hearn
Assistant Examiner—Kevin McAndrews
Attorney, Agent, or Firm—Stephen J. Limanek

[57] ABSTRACT

A method or process is provided for making a semiconductor structure which includes the steps of forming in a semiconductor body a P/N junction and an opening in an insulating layer disposed on the surface of the semiconductor body. A trench is then formed in the semiconductor layer having a sidewall located along a given plane through the opening and through the P/N junction. An insulating material is disposed within the trench and over the insulating layer and a block or segment of material is located over the trench so as to extend a given distance from the trench over the upper surface of the body. The insulating material and the block are then etched so as to remove the block and the insulating material located along the sides of the block. A layer of low viscosity material is formed over the semiconductor body so as to cover the remaining portion of the insulating material, the layer of low viscosity material and the insulating material having similar etch rates. The layer of low viscosity material and the insulating material are then simultaneously etched directionally until all of the layer of low viscosity material is removed. Metallic contacts may now be formed on the surface of the semiconductor body without the concern that the metallic material will seep or enter into the trench causing a short at the P/N junction.

20 Claims, 9 Drawing Figures

METHOD OF MAKING A CONTACT TO A TRENCH ISOLATED DEVICE

DESCRIPTION

1. Technical Field

This invention relates to a method of making integrated semiconductor devices and circuits and more particularly to a method of making a contact to a trench isolated device, such as a bipolar transistor electrically isolated by a trench or groove.

2. Background Art

Trenches filled with insulating material, such as polyimide, for isolating devices, e.g., transistors, in integrated semiconductor circuits have been known to provide significant device or transistor density improvements over other known isolation techniques.

In IBM Technical Disclosure Bulletin, Vol. 24, No. 11A, April, 1982, pp. 5458-5459, there is disclosed an NPN transistor having an emitter butted against the sidewall of a trench filled with insulating material. Filling a trench with silicon dioxide and silicon nitride is shown in IBM Technical Disclosure Bulletin Vol. 23, No. 11, April, 1981, pp. 4917-4919, with portions of the silicon nitride being removed by a reactive ion etching (RIE) technique. Filling a V-groove trench with polyimide is taught in IBM Technical Disclosure Bulletin, Vol. 17, No. 10, March, 1975, pp. 2893-2894.

U.S. Pat. No. 3,385,729, filed on Oct. 25, 1964, by G. A. Larchian, discloses an isolation trench having a sidewall covered first with a layer of silicon dioxide and then with a layer of silicon nitride, and U.S. Pat. No. 4,242,156, filed on Oct. 15, 1979, by J. L. Peel, teaches the formation of a silicon nitride layer over a silicon dioxide layer on a sidewall to prevent oxide breakdown.

In U.S. Pat. No. 4,048,649, filed on Feb. 6, 1976, by R. Bohn, there is shown a base of a transistor butted against a V-groove trench lined with a layer of silicon dioxide on which is formed a layer of silicon nitride, and in U.S. Pat. No. 4,174,252, filed on July 26, 1978, by H. Kressel et al, there is disclosed an emitter of a transistor protected on a sidewall by a layer of oxygen-doped polysilicon over which is formed a layer of silicon nitride with a contact opening formed in the central portion of the top surface of the emitter.

An emitter of a transistor butted against a silicon dioxide region with an emitter contact overlapping the silicon dioxide region is illustrated in U.S. Pat. No. 4,110,779, filed on Dec. 13, 1976, by R. Rathbone et al.

In commonly assigned U.S. Pat. No. 4,196,440, filed by N.G. Anantha et al on May 25, 1978, there is disclosed an emitter of an NPN transistor spaced from the wall of a trench, and in U.S. Pat. No. 4,369,565, filed by A. Muramatsu on Aug. 21, 1980, there is disclosed a trench protected from a non-butting contact by an insulating layer grown simultaneously within the trench and on the upper surface of the semiconductor structure.

In commonly assigned U.S. Pat. No. 4,519,128, filed on Oct. 5, 1983, by D. G. Chesebro and J. F. Soychak and issued on May 28, 1985, there is disclosed a trench having a butted emitter formed in a semiconductor substrate having thin layers of silicon dioxide and silicon nitride formed on the remainder of the trench filled with polyimide. Any excess polyimide is removed after being thermally cured by known etch back techniques.

It has been found that when the filling material in a trench is etched back an undesired step is formed between the surface of the substrate and the top of the filling material due to either over etching or under etching the filling material and due to the contour of the filling material at the trench. Such a step causes discontinuities in conductive lines or wiring subsequently formed over the substrate which reduces the reliability of these integrated circuits. Commonly assigned U.S. patent application having Ser. No. 793,400, filed by James J. Dougherty on Oct. 31, 1985, now U.S. Pat. No. 4,654,120, a simple method for providing a planar surface at the vicinity of a trench by protecting the filling material over the trench with an appropriate block during a first etching step, forming a layer of photoresist over the remaining portion of the filling material and etching the photoresist and the remaining filling material at the same rate. It has also been found that contacts made adjacent to the trench often cause a short at a P/N junction on the sidewall of a trench due to seepage of conductive contact material into the trench, particularly when butted emitters are used in transistor circuits. Thus, in many semiconductor structures, emitters are not allowed to butt the isolation trench because of the danger of shorting the emitter to base when contacting the emitter with metal.

DISCLOSURE OF THE INVENTION

It is an object of this invention to provide an improved and highly reliable method of making small semiconductor devices in a semiconductor substrate having electrical contacts without causing a short at a P/N junction located within a trench near the surface of the substrate.

In accordance with the teachings of this invention a method or process is provided for making a semiconductor structure which includes the steps of forming in a semiconductor body a P/N junction within an opening in a first insulating layer disposed on the surface of the semiconductor body. A trench is then formed in the semiconductor layer having a sidewall located along a given plane through the opening and through the P/N junction. A second layer of insulation is formed within the opening and on the sidewall of the trench. An insulating material is disposed within the trench and over the second insulating layer in the opening and a block or segment of material is located over the trench so as to extend a given distance from the trench over the surface. The insulating material and the block are then etched simultaneously so as to remove the block and the insulating material without, or outside of, the block. The exposed portions of the second insulating layer are now etched to form an opening therein. A layer of low viscosity material, such as a photoresist, is formed over the semiconductor body so as to cover the remaining portion of the insulating material, the layer of low viscosity material and the insulating material having similar etch rates. The layer of low viscosity material and the insulating material are then etched directionally, e.g., by a reactive ion etching process (RIE), until all of the layer of low viscosity material is removed to the surface of the second insulating layer. Any suitable wet etchant may then be used to remove any remaining low viscosity material disposed within the second opening in the second layer of insulation. Metallic contacts may now be formed, e. g., by evaporation, on the surface of the semiconductor body within the second opening in the second insulating layer without the concern that the metallic material will seep or enter into the trench causing a short at the P/N junction.

In a preferred embodiment of the invention, the insulating material is polyimide and the block of material, as well as the layer of low viscosity material, is made of photoresist.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
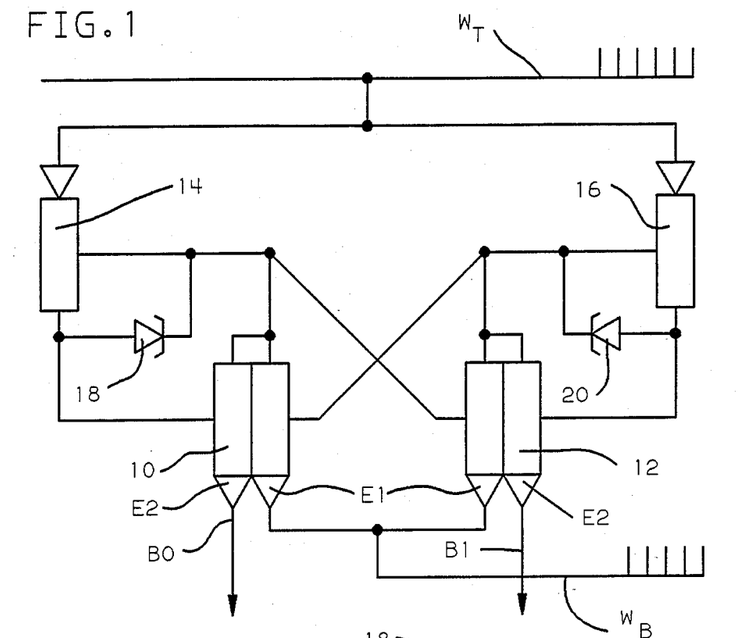
FIG. 1 is a circuit diagram of a cross coupled memory cell which can be advantageously made by the practice of this invention.

Referring to the drawings in more detail there is shown in FIG. 1 a circuit diagram of a cross-coupled bipolar memory cell of the type disclosed in commonly assigned U.S. Pat. No. 3,603,820 filed by C. H. Schuenemann on Nov. 26, 1968, which can be readily made in integrated circuit form within a small surface area by the practice of the method of the present invention. The circuit of the cell includes first and second cross-coupled dual emitter NPN transistors 10 and 12, respectively, cross-coupled at their collectors and bases, and first and second PNP transistor 14 and 16, respectively, with the first transistor 14 having its base and collector connected to the collector and base, respectively, of the first cross-coupled transistor 10 and the second transistor 16 having its base and collector connected to the collector and base, respectively, of the second cross-coupled transistor 12. A first Schottky diode 18 is connected between the base and collector of the first cross-coupled transistor 10 and a second Schottky diode 20 is connected between the base and collector of the second cross-coupled transistor 12. The emitters of the first and second PNP transistors 14 and 16 are connected to a word top line $W_T$ and a first emitter E1 of each of the dual emitter transistors 10 and 12 is connected to a word bottom line $W_B$. A second emitter E2 of each of the dual emitter transistors 10 and 12 is connected to bit lines B0 and B1, respectively.

As is known, the memory cell illustrated in FIG. 1 of the drawings operates as a bistable circuit with writing being performed, after selecting the word lines $W_T$ and $W_B$, by applying complementary signals to the second emitters E2 of the cross-coupled transistors 10 and 12 from bit lines B0 and B1, respectively, and reading being performed by sensing the signals at these same emitters E2 with an appropriate sense amplifier, not shown, connected to the bit lines B0 and B1.

In accordance with the teachings of this invention, the memory cell circuit of FIG. 1 may be fabricated by the method indicated in FIGS. 2 through 9 of the drawings.

Figure 2:
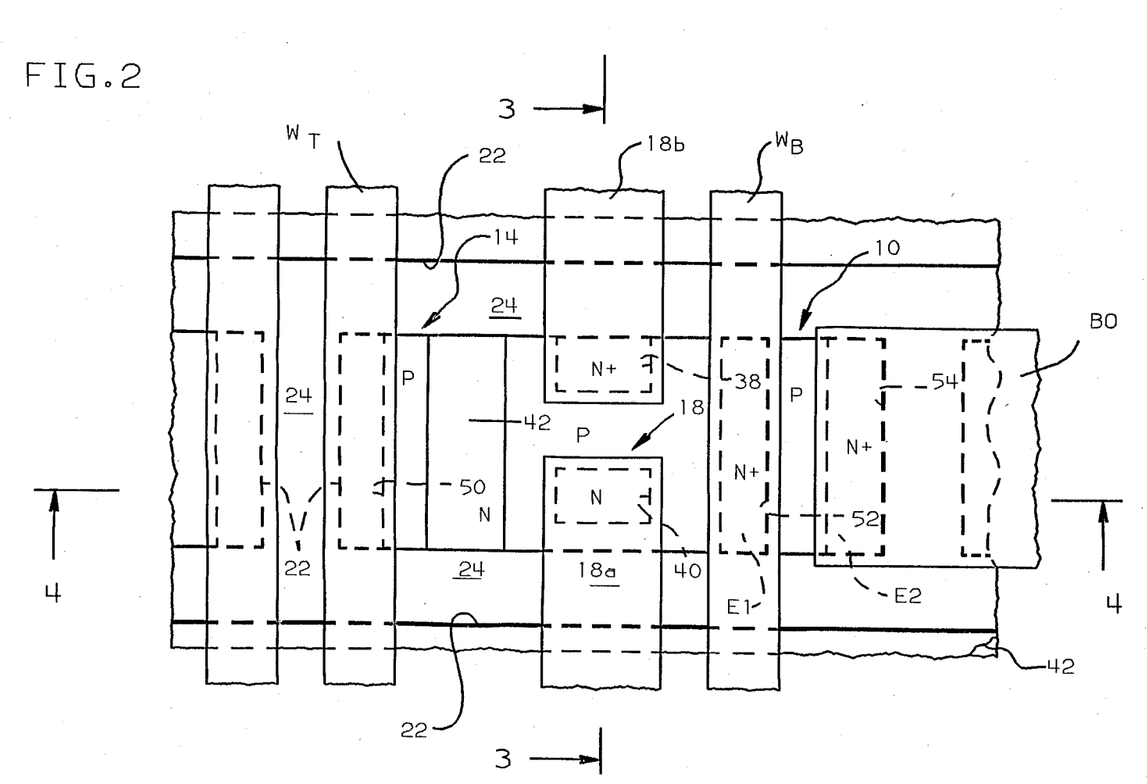
FIG. 2 is a plan view of a semiconductor structure including a portion of the cell illustrated in FIG. 1 that can be made by the practice of this invention.

FIG. 2 of the drawings illustrates a plan view of a portion of an integrated semiconductor structure in which is formed a half cell of the memory cell shown in FIG. 1. The half cell includes the first NPN transistor 10, the first PNP transistor 14 and the first Schottky diode 18. A similar half cell, not shown, can be made in an adjacent area of the semiconductor structure to form the second NPN transistor 12, the second PNP transistor 16 and the second Schottky diode 20.

As indicated in the plan view of FIG. 2, the first NPN transistor 10, the first PNP transistor 14 and the first Schottky diode 18 are formed within a trench 22 which is filled with an insulating material 24, preferably, polyimide. The word top line $W_T$ is shown in contact with a P diffusion region, acting as an emitter of the first PNP transistor 14, through an opening 50 in a layer of silicon dioxide 42, the word bottom line $W_B$ is shown in contact with the first emitter E1 of the NPN transistor 10 at a first N+ region through an opening 52 in the silicon dioxide layer 42 and the bit line B0 is shown in contact with the second emitter E2 of the NPN transistor 10 at a second N+ region through an opening 54 in the silicon dioxide layer 42. The first Schottky diode 18 is formed by contacting a first conductive line 18a to an N region through an opening 40 in the silicon dioxide layer 42. The first conductive line 18a is also in contact with the P diffusion region, acting as a base of the first NPN transistor 10. A second conductive line 18b contacts the collector of the first NPN transistor 10 at an N+ region through an opening 38 in the silicon dioxide layer 42.

Figure 3:
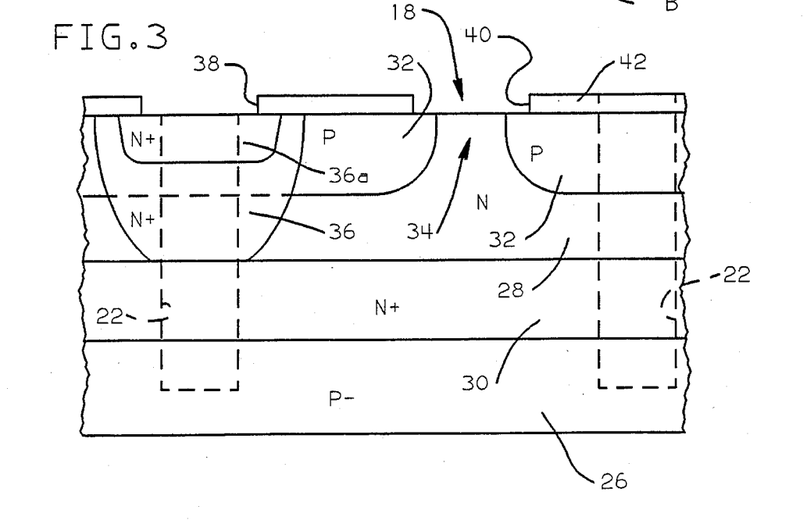
FIG. 3 is a sectional view of the structure illustrated in FIG. 2 taken along line 3—3.

The steps of the method of the present invention used to make the semiconductor memory structure shown in plan view in FIG. 2 are indicated in cross-sectional views in FIGS. 3 through 9 of the drawings. As shown in FIG. 3, which is a sectional view taken along line 3—3 of FIG. 2, a semiconductor substrate 26, preferably silicon, having a P− type conductivity, has an N type epitaxial layer 28 grown thereon with an N+ subcollector region 30 formed in any known manner. A P type base region 32 of the first transistor 10 has an opening 34 therein. The base region 32 may be formed by using any known diffusion or ion implantation technique employing boron as the impurity. A reach-through region 36 is provided from the surface of the epitaxial layer 28 to the subcollector region 30 through the P base region 32. A more heavily doped N+ segment 36a of the reach-through region 36 is provided at the surface of the epitaxial layer 28 to serve as an electrical contact for subsequent wiring. Openings 38 and 40, as also indicated in FIG. 2 of the drawings, are provided in the layer of silicon dioxide 42 grown on the epitaxial layer 28. The location of the trench 22, which is to be formed in a subsequent step, is indicated by dashed lines.

Figure 4:
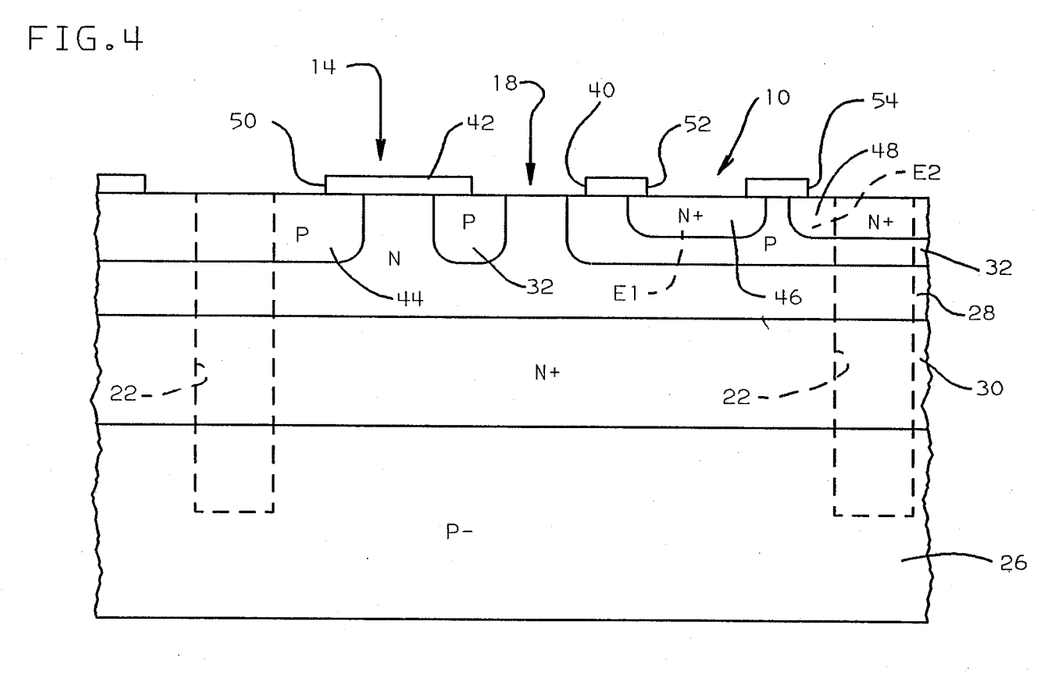
FIG. 4 is a sectional view of the structure illustrated in FIG. 2 taken along line 4—4 during an early stage of the inventive process.

FIG. 4 of the drawings is a sectional view taken along line 4—4 of FIG. 2 prior to the formation of the trench 22 indicated in FIG. 2 and by dashed lines in FIGS. 3 and 4. As can be seen in FIG. 4, a P type conductivity region 44, which serves as the emitter of the first PNP transistor 14, is formed within the N epitaxial layer 28 and spaced from the P base region 32 of the first NPN transistor 10. Thus, P region 44, N epitaxial layer 28 and P region 32 serve as the emitter, base and collector, respectively, of the first PNP transistor 14. Also seen in FIG. 4 are first and second N+ regions 46 and 48 formed in the P base region 32. These two N+ regions 46 and 48 serve as the first and second emitters E1 and E2, respectively, of the first NPN transistor 10, with P region 32 being the base and N epitaxial layer 28 being the collector of this transistor 10. The layer of silicon dioxide 42 has, in addition to the openings 38 and 40, the openings 50, 52 and 54 for subsequent wiring to the P emitter region 44, the first emitter region 46 and the second emitter region 48, respectively.

After forming the diffusion regions 32, 44, 46 and 48 within the epitaxial layer 28 and the openings 38, 40, 50, 52 and 54 in the layer of silicon dioxide 42, the trench 22 is formed to electrically isolate the first NPN transistor 10, the first PNP transistor 14 and the first Schottky diode 18 from other segments of the integrated semiconductor structure which may contain many thousands of similar bipolar memory cells. As indicated in the plan view of FIG. 2 of the drawings and more clearly illustrated in FIG. 5, a first portion of the trench 22 passes through the surface of the epitaxial layer 28 within the opening 54 in the layer of silicon dioxide 42 and extends through the second N+ emitter region 48, the P base region 32 and the N+ subcollector region 30 into the P− substrate 26. Also, another portion of the trench 22 passes through the opening 50 in silicon dioxide layer 42, the P emitter region 44 and the N+ subcollector region 30 into the P− substrate 26. Furthermore, as shown in FIGS. 2 and 3 of the drawings, a further portion of the trench 22 passes through opening 38 in silicon dioxide layer 42 and the reach-through region 36 into the P− substrate 26, and yet another portion of the trench passes through the P base region 32 from the surface thereof and the N+ subcollector region 30 into the P− substrate 26.

The trench 22 may be made by any known technique but preferably by the reactive ion etching (RIE) methods disclosed in the hereinabove identified commonly assigned U.S. Patents by D. G. Chesebro and F. J. Soychak and by J. J. Dougherty.

Figure 5:
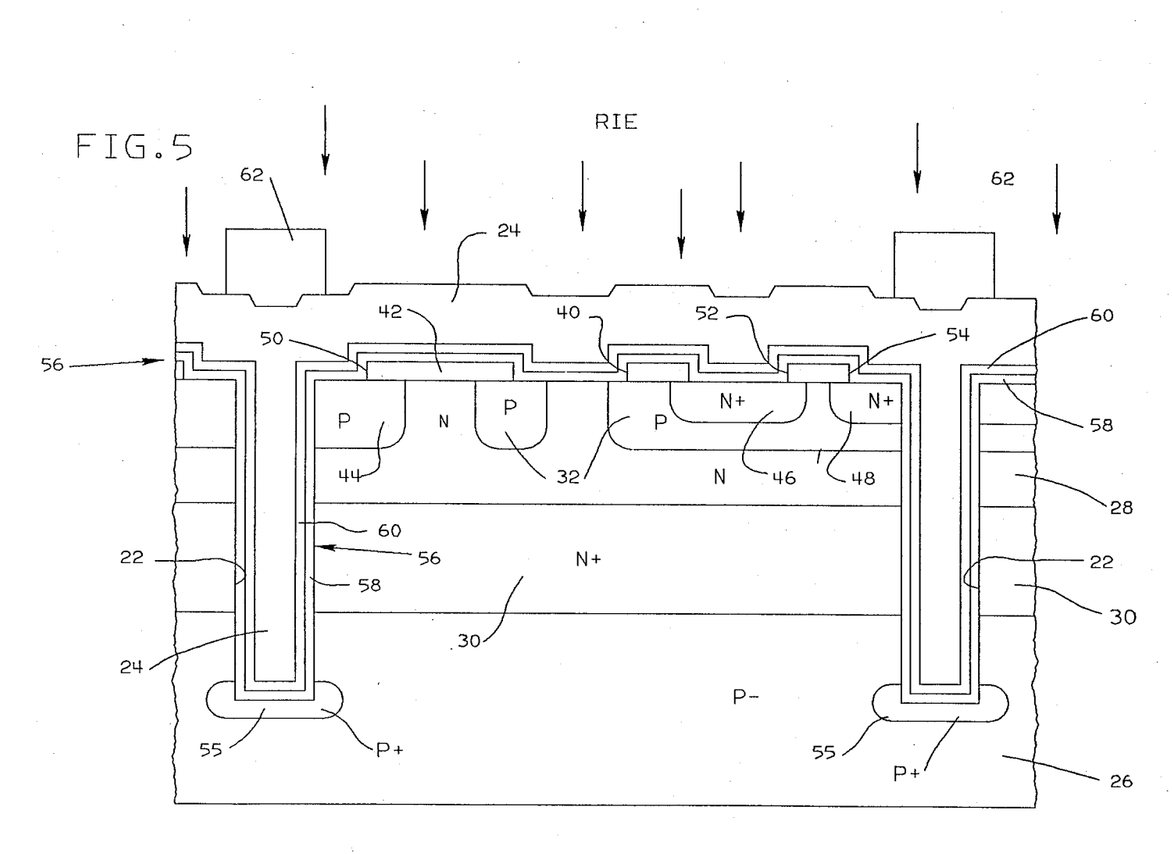
FIGS. 5-9 are sectional views of the structure similar to that of FIG. 4 but taken during later successive stages of the inventive process.

After forming the trench 22, as also shown in FIG. 5, dual layer of insulation 56 is provided to coat the sidewalls and the bottom of the trench 22 as well as the surface or top of the semiconductor structure. The dual layer of insulation 56 preferably includes a first layer of silicon dioxide 58 and a second layer of silicon nitride 60 which are conformally applied by any known techniques. If desired, a thin layer of silicon dioxide, not shown, may be grown on the sidewalls and bottom of the trench 22 prior to applying the dual insulation layer 56. Also, if desired, prior to forming the dual insulation layer 56, a P+ channel stop region 55 may be formed at the bottom of the trench 22 by implanting boron ions.

Figure 6:
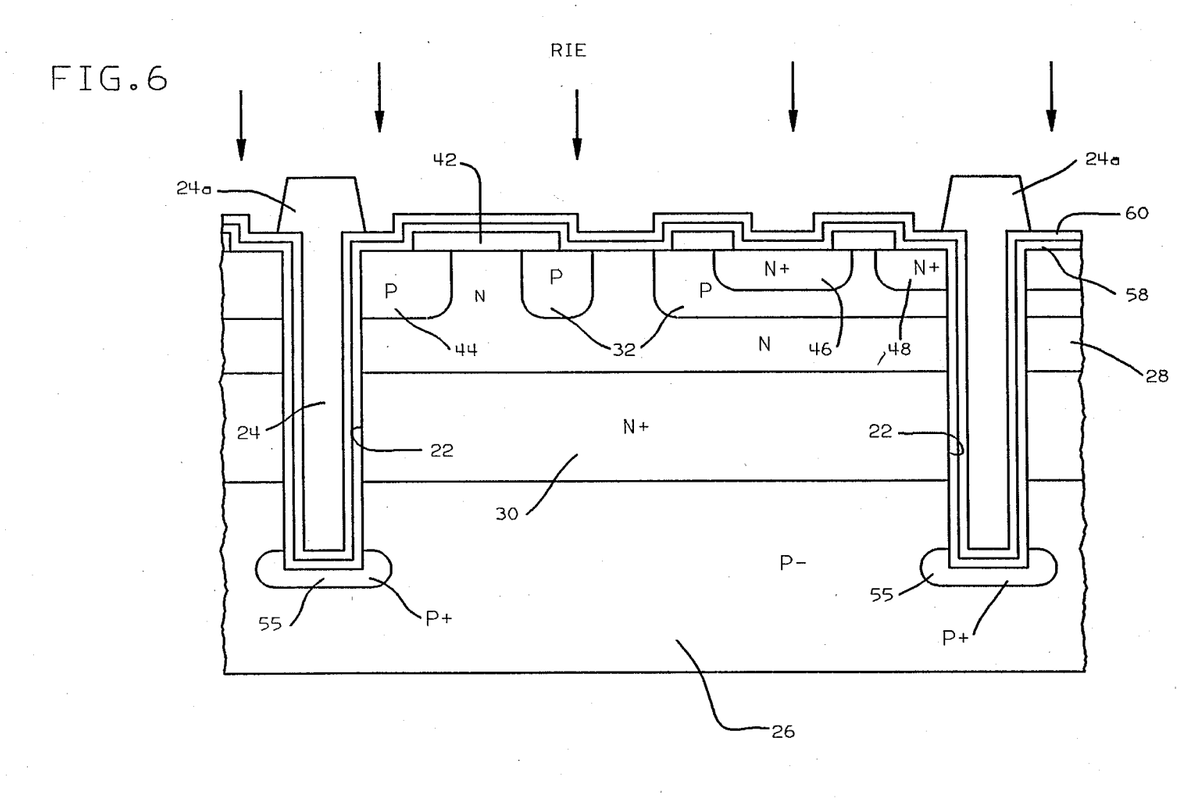

The insulating material 24, preferably polyimide, as stated hereinabove in connection with FIG. 2, is then deposited on the surface of the structure so as to flow into the trench 22, completely filling the trench, and providing a coating over the epitaxial layer 28. As disclosed in the commonly assigned U.S. Patents by J. J. Dougherty, two or more applications of the polyimide with appropriate curing may be required to satisfactorily fill the trench 22. After the polyimide step is completed, a layer of photoresist is applied over the cured polyimide 24 and by employing known masking and etching techniques a block or segment 62 of the photoresist is formed over the trench 22 and over the surface of the epitaxial layer 28 extending a given distance from the trench 22. The photoresist block 62 preferably has an etch rate with a given etchant which is similar to the etch rate of the polyimide with the given etchant. The etching is preferably performed by using known dry reactive ion etching (RIE) techniques in an oxygen ambient. Any suitable commercial photoresist material and polyimide may be used which etch at the same rate with a given etchant. Polyimides that are particularly suitable for use in this process are those which have a molecular weight of, preferably, from 5,000 to 25,000 grams per gram mole, such as the polyamic acid in the solvent. N-methyl-2-pyrrolidone and xylene, 37% solids and 3.0–4.0 viscosity, available from E. I. DuPont de Nemours & Co. (Inc. as part number PI 2560. After the block 62 is formed, the block 62 and the polyimide 24 are etched simultaneously in a vertical direction by the reactive ion etching (RIE) techniques until the silicon nitride layer 60 is exposed in all areas except under the block 62 at the trench 22, as indicated in FIG. 6 of the drawings. As can be seen, the entire block 62 is removed along with the polyimide 24 over the epitaxial layer 28 except for the polyimide filling the trench 24 and a cap or segment 24a of the polyimide located above the trench 22 in the area defined by the block 62. It should be noted that the edges or wings of the cap 24a extend over the epitaxial layer 28 for a given distance from the sidewalls of the trench 24.

Figure 7:
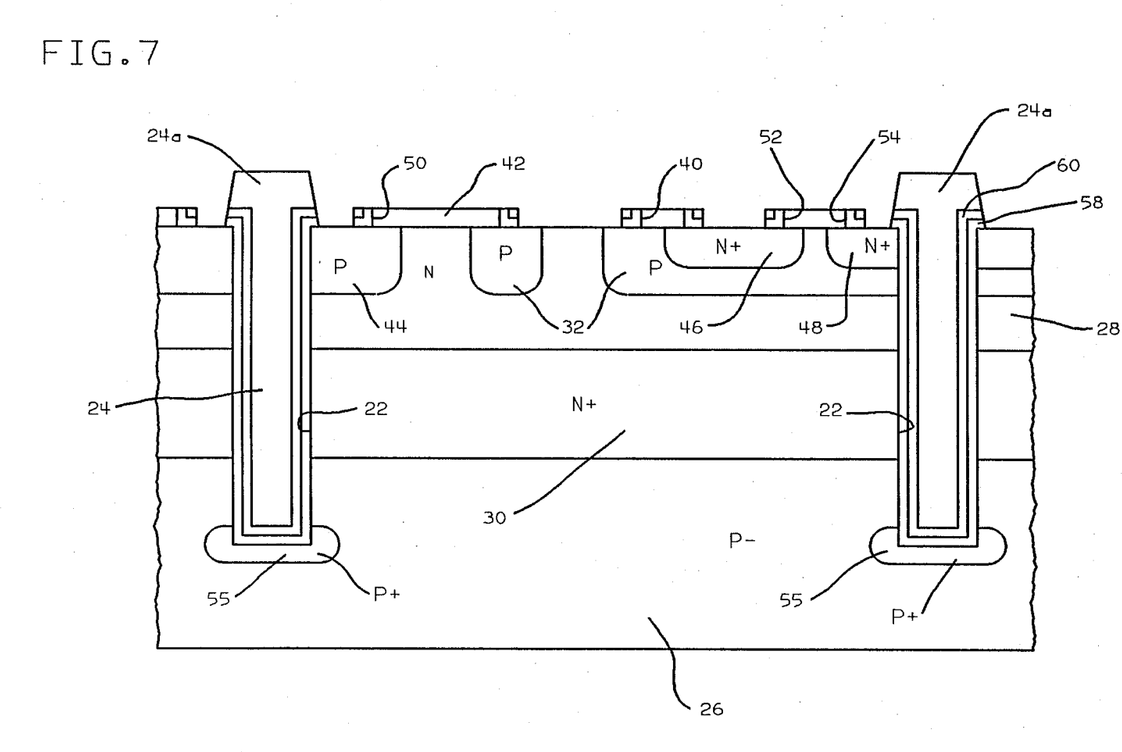

An etchant, preferably carbon tetrafluoride plus oxygen ($CF_4+O_2$), is now used in a reactive ion etching technique to remove the silicon nitride layer 60 and the silicon dioxide layer 58 in all areas except along the vertical sides of the silicon dioxide layer 42 and under the cap 24a so as to expose the surface of the epitaxial layer 28 at the P emitter region 44, the P base region 32 and N collector region 28 and the N+ emitter regions 46 and 48, as illustrated in FIG. 7 of the drawings. As is known, an appropriate monitor can be used to terminate the etching when the surface of the epitaxial layer 28 becomes exposed.

Figure 8:
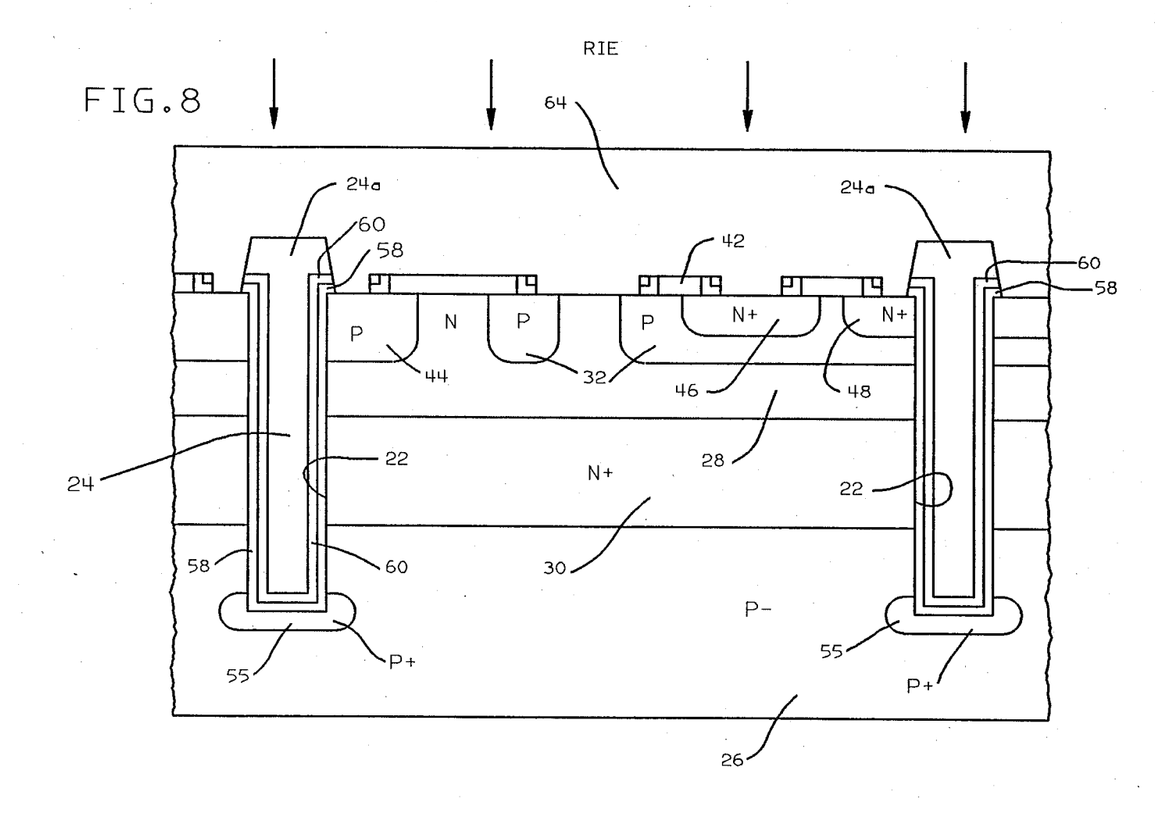
Figure 9:
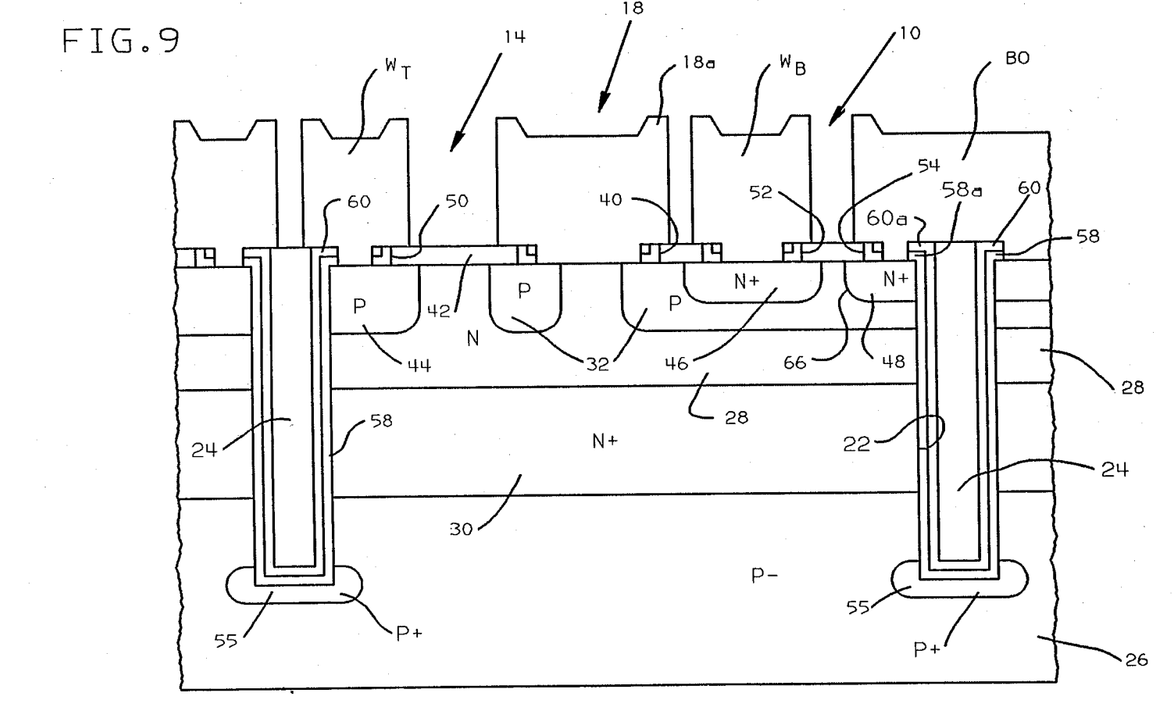

To complete the planarization of the surface of the semiconductor structure, a layer of photoresist 64 is applied over the entire surface of the structure so as to cover the polymide cap 24a, as shown in FIG. 8. By using directional reactive ion etching (RIE) techniques, with preferably oxygen as the etchant, the photoresist layer 64 and the polyimide cap 24a are etched simultaneously at the same rate until the surface of the silicon nitride layer 60 above the trench 22 is exposed, as indicated in FIG. 9 of the drawing. Any photoresist from photoresist layer 64 remaining in the openings 38, 40, 50, 52 and 54 in the silicon dioxide layer 42 may now be removed by employing a dip etch with a suitable solvent, e. g., a solution containing 10% potassium hydroxide, which will not attack the polyimide 24. Appropriate wiring is provided for the elements of transistors 10 and 14 and the diode 18 by evaporating a metallic material, preferably aluminum doped with copper and silicon over the entire structure and, suitably etching it to form the word top line $W_T$ in contact with the P emitter diffusion region 44, the anode 18a in contact with the N epitaxial layer 28 and the P base diffusion region 32, the word bottom line $W_B$ in contact with N+ emitter diffusion region 46 and the bit line B0 in contact with the N+ diffusion region 48.

It should be noted that by using the method of the present invention to make the disclosed semi-conductor structure all P/N junctions, such as junction 66 formed between the second N+ emitter region 48 and the P base region 32, which terminate at the sidewall of the trench 22 are protected by horizontal segments 58a and 60a of the silicon dioxide layer 58 and silicon nitride layer 60, respectively, from highly viscous conductive material flowing or seeping along the sidewall of the trench 22 to the P/N junction 66. Thus, a short circuit of the P/N junction 66 in trench 22 is avoided. It should be appreciated that in practice the P/N junction 66 at the trench 22 is normally only about 0.5 micrometers from the upper surface of the N+ emitter 48. Accordingly, by practicing the present invention, semiconductor structures such as the bipolar memory cell shown in the circuit diagram of FIG. 1 can be made with considerable improvement in reliability and yield, as well as in planarity. Furthermore, it should be noted that by the practice of this invention a very small cell can be made since small, accurately defined contact areas are provided on the surfaces of the transistor elements, such as at the N+ emitter diffusion region 48. The method of this invention insures non-butting the contacts to the sidewall of the trench while maintaining small device sizes.

Although the method of this invention has been described in connection with the making of a static bipolar memory cell, it should be understood that the invention can be used to make many other semiconductor structures, such as field effect transistors, which include a trench or groove having a P/N junction terminating at the sidewall thereof and which use in their formation a highly viscous conductive material above the trench or groove.

While the invention has been particularly shown and described with reference to preferred embodiments thereof, it will be understood by those skilled in the art that various changes in form and details may be made therein without departing from the spirit and scope of the invention.

What is claimed is:

1. A method of making a semiconductor structure comprising the steps of
    forming in a semiconductor body a P/N junction,
    forming a first opening in a first insulating layer disposed on the surface of said semiconductor body,
    forming a trench in said body through said surface within said opening and through said P/N junction,
    coating said trench and said surface within said opening with a second insulating layer,
    disposing an insulating material within said trench and over said second insulating layer on said surface,
    forming a block of material over said trench so as to extend a given distance from said trench over said surface wherein at least an edge of said block is within said first opening,
    etching said insulating material and said block so as to remove said block and said insulating material disposed on said second insulating layer without said block,
    etching the exposed portions of said second insulating layer to form a second opening therein within the first opening of said first insulating layer,
    forming a layer of low viscosity material over said semiconductor body so as to cover the remaining portion of said insulating material, said layer of low viscosity material and said insulating material having similar etch rates,
    etching simultaneously said layer of low viscosity material and said insulating material until all of said layer of low viscosity material is removed at least to the surface of said second insulating layer at said trench, and
    forming an electrical contact with the surface of said semiconductor body within the second opening in said second insulating layer after removing any remaining low viscosity material from within said second opening.

2. A method as set forth in claim 1 wherein said insulating material is polyimide.

3. A method as set forth in claim 1 wherein said second insulating layer is a dual insulating layer including a layer of silicon dioxide and a layer of silicon nitride.

4. A method as set forth in claim 1 wherein said block of material is photoresist.

5. A method as set forth in claim 4 wherein said insulating material is polyimide.

6. A method as set forth in claim 2 wherein said layer of low viscosity material is photoresist.

7. A method as set forth in claim 1 wherein said etching is performed in a directional manner.

8. A method as set forth in claim 7 wherein said etching is a reactive ion etching (RIE) process.

9. A method as set forth in claim 1 wherein said semiconductor body is silicon and said first insulating layer is silicon dioxide grown on said body.

10. A method as set forth in claim 1 wherein said P/N junction is formed between a P type conductivity region and an N type conductivity region disposed at the surface of said semiconductor body.

11. A method as set forth in claim 1 wherein said electrical contact is formed by evaporating a conductive material on the surface of said semiconductor body.

12. A method as set forth in claim 11 wherein said conductive material includes aluminum.

13. A method as set forth in claim 12 wherein said aluminum is doped with copper and silicon.

14. A method as set forth in claim 1 wherein said trench is formed by using a reactive ion etching (RIE) process.

15. A method as set forth in claim 1 wherein said insulating material and said block are etched simultaneously.

16. A method of making a semiconductor structure comprising the steps of
    forming in a semiconductor body a P/N junction within an opening in a first insulating layer disposed on the surface thereof,
    forming a trench in said body through said surface within said opening and through said P/N junction,
    coating said trench and said surface within said opening with a second insulating layer,
    disposing an organic material having a high molecular weight within said trench and over said second insulating layer on said surface,
    forming a block of material over said trench so as to extend a given distance over said surface wherein at least an edge of said block is within said opening, said organic material and said block having similar etch rates,
    etching simultaneously said organic material and said block so as to remove said block and said organic material disposed on said second insulating layer without said block,
    etching the exposed portions of said second insulating layer,
    forming a layer of material having a low molecular weight over the surface of said semiconductor body so as to cover the remaining portion of said organic material, said layer of material and said organic material having similar etch rates, etching simultaneously said layer of material and said organic material so as to remove said organic material disposed above the trench, and forming an electrical contact with the surface of said semiconductor body within the opening in said second insulating layer after removing any low molecular weight material remaining within the opening in said second insulating layer.

17. A method as set forth in claim 16 wherein said semiconductor body is silicon and said organic material is polyimide.

18. A method as set forth in claim 17 wherein each of said etching steps is a dry etching process.

19. A method as set forth in claim 17 wherein said block and said layer of material are made of a photoresist material.

20. A method of making a semiconductor structure comprising the steps of forming in a silicon body a P/N junction, forming an opening in a first layer of silicon dioxide disposed on the surface of said body, forming a trench in said body through said surface within said opening and through said P/N junction, forming a second layer of silicon dioxide along the sidewalls and bottom of said trench, on said surface within the opening in said first layer of silicon dioxide and on the surface of said first layer of silicon dioxide, forming a layer of silicon nitride on the surface of said second layer of silicon dioxide, disposing polyimide within said trench and over said layer of silicon nitride without said trench, forming a block of photoresist over said trench on said polyimide so as to extend a given distance from said trench over the surface of said silicon body wherein at least an edge of said block is within said opening, said photoresist block and said polyimide having similar etch rates, reactively ion etching simultaneously said photoresist block and said polyimide so as to remove said block and said polyimide disposed on said silicon nitride layer without said block to form a polyimide wing segment extending substantially said given distance from said trench, reactively ion etching exposed portions of said silicon nitride layer and said second silicon dioxide layer to form a second opening within said silicon nitride layer and said second silicon dioxide layer within the first opening of said first silicon dioxide layer, forming a layer of photoresist over said silicon body so as to cover said polyimide wing segment, said layer of photoresist and said polyimide having similar etch rates, etching simultaneously said photoresist layer and said polyimide until said polyimide wing segment is removed, removing any photoresist remaining within said second opening, and evaporating a metal on the surface of said silicon body within said second opening.

* * * * *